United States Patent
Matsumura et al.

(10) Patent No.: US 10,470,341 B2
(45) Date of Patent: Nov. 5, 2019

(54) MOVEMENT MANAGEMENT DEVICE, MOVEMENT MANAGEMENT METHOD, AND COMPUTER-READABLE RECORDING MEDIUM

(71) Applicants: FUJITSU LIMITED, Kawasaki-shi, Kanagawa (JP); FUJITSU FIP CORPORATION, Minato-ku, Tokyo (JP)

(72) Inventors: Masafumi Matsumura, Yokohama (JP); Minoru Tanaka, Kawasaki (JP); Yuji Tomiyoshi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 506 days.

(21) Appl. No.: 15/245,900

(22) Filed: Aug. 24, 2016

(65) Prior Publication Data
US 2017/0086327 A1  Mar. 23, 2017

(30) Foreign Application Priority Data

Sep. 17, 2015  (JP) .................... 2015-184501

(51) Int. Cl.
*H05K 7/00* (2006.01)
*H05K 7/20* (2006.01)
*H05K 7/14* (2006.01)

(52) U.S. Cl.
CPC ....... *H05K 7/20836* (2013.01); *H05K 7/1498* (2013.01); *G05B 2219/2614* (2013.01)

(58) Field of Classification Search
None
See application file for complete search history.

(56) References Cited

U.S. PATENT DOCUMENTS

| 5,128,912 A | 7/1992 | Hug et al. |
| 9,801,517 B2 * | 10/2017 | High ..................... E01H 5/12 |
| 9,843,470 B1 * | 12/2017 | Gartrell ................. H04L 29/08 |

FOREIGN PATENT DOCUMENTS

| JP | 2-154357 | 6/1990 |
| JP | 5-35407 | 2/1993 |
| JP | 2011-214844 | 10/2011 |
| JP | 2013-149905 | 8/2013 |

* cited by examiner

Primary Examiner — Russell S Glass
(74) Attorney, Agent, or Firm — Xsensus LLP

(57) ABSTRACT

A movement management device specifies, when a data center includes separated areas of a first area in which a server rack is installed and a second area in which a worker works, a worker who enters the second area. The movement management device specifies a target server rack to be operated by the specified worker from among a plurality of server racks installed in the first area. The movement management device moves the specified target server rack from the first area to the second area that the worker enters.

7 Claims, 14 Drawing Sheets

FIG.5

| WORKER ID | COMPANY NAME AND DEPARTMENT NAME | NAME OF PERSON IN CHARGE | RACK NO. |
|---|---|---|---|
| U0001 | AAA CO., LTD. | MR. AAA | 105 |
| U0002 | BBB DEPARTMENT, BBB CO., LTD. | MR. BBB | 107 |
| ... | ... | ... | ... |

FIG.6

| WORK ROOM ID | RACK NO. | EXPECTED WORK COMPLETION TIME |
|---|---|---|
| WORK ROOM A | empty | - |
| WORK ROOM B | empty | - |
| WORK ROOM C | 107 | 13:30:00 |
| ... | ... | ... |

FIG.7

| INSTALLATION LOCATION ID | RACK NO. | MEASURED TEMPERATURE [°C] | CONTROLLING A/C |
|---|---|---|---|
| Area-A1 | 101 | 23.5 | A/C A |
| Area-A2 | 102 | 24.2 | A/C A |
| Area-A3 | 103 | 25.1 | A/C A |
| Area-A4 | 104 | 23.6 | A/C A |
| Area-A5 | temp | 22.9 | A/C A |
| Area-A6 | 106 | 25.4 | A/C A |
| Area-A7 | temp | 22.5 | A/C A |
| Area-A8 | empty | 23.9 | A/C A |
| Area-B1 | empty | 22.4 | A/C B |
| ... | ... | ... | ... |
| Area-B5 | 205 | 24.9 | A/C B |
| ... | ... | ... | ... |

FIG.8

| MANAGEMENT NUMBER | MOVEMENT ORIGIN | MOVEMENT DESTINATION | MOVEMENT ROUTE | NORMAL MOVEMENT TIME |
|---|---|---|---|---|
| 1 | Area-A1 | WORK ROOM A | LINE 1→LINE 5→LINE 30 | 00:16:00 |
| 2 | Area-A1 | WORK ROOM B | LINE 1→LINE 5→LINE 26→LINE 31 | 00:28:00 |
| ... | ... | ... | ... | ... |
| 21 | Area-A5 | WORK ROOM A | LINE 1→LINE 5→LINE 30 | 00:16:00 |
| 22 | Area-A5 | WORK ROOM B | LINE 1→LINE 5→LINE 26→LINE 31 | 00:28:00 |
| ... | ... | ... | ... | ... |
| 201 | LINE 1 | LINE 31 | LINE 5→LINE 26 | 00:15:00 |
| ... | ... | ... | ... | ... |

FIG.9

| RACK NO. | MOVEMENT ORIGIN | MOVEMENT DESTINATION | CURRENT POSITION | EXPECTED MOVEMENT COMPLETION TIME |
|---|---|---|---|---|
| 105 | Area-A5 | WORK ROOM A | LINE 30 | 13:00:00 |
| ... | ... | ... | ... | ... |
| 107 | WORK ROOM C | Area-A7 | Area-A7 | MOVEMENT COMPLETED |
| ... | ... | ... | ... | ... |

FIG.10

| RACK NO. | INSTALLATION LOCATION ID | GENERATED HEAT AMOUNT [kJ/h] | BACKUP | STOP MACHINE DURING WORK |
|---|---|---|---|---|
| 101 | Area-A1 | 420 | Y | N |
| 102 | Area-A2 | 618 | N | N |
| ... | ... | ... | ... | ... |
| 105 | Area-A5 | 560 | Y | Y |
| ... | ... | ... | ... | ... |
| 205 | Area-B5 | 580 | Y | Y |
| ... | ... | ... | ... | ... |

| RACK NO. | INSTALLATION LOCATION ID | GENERATED HEAT AMOUNT [kJ/h] | BACKUP | STOP MACHINE DURING WORK |
|---|---|---|---|---|
| 101 | Area-A1 | 420 | Y | N |
| 102 | Area-A2 | 618 | N | N |
| ... | ... | ... | ... | ... |
| 105 | Area-A5 | 560 | Y | Y |
| ... | ... | ... | ... | ... |
| 205 | Area-A8 | 580 | Y | Y |
| ... | ... | ... | ... | ... | ns
MOVEMENT MANAGEMENT DEVICE, MOVEMENT MANAGEMENT METHOD, AND COMPUTER-READABLE RECORDING MEDIUM

CROSS-REFERENCE TO RELATED APPLICATION

This application is based upon and claims the benefit of priority of the prior Japanese Patent Application No. 2015-184501, filed on Sep. 17, 2015, the entire contents of which are incorporated herein by reference.

FIELD

The embodiments discussed herein are related to a movement management device, a movement management method, and a computer-readable recording medium.

BACKGROUND

Typically, machines such as servers owned by a plurality of companies at a data center, for example, are mounted on server racks and installed collectively in a machine room because of space limitations, air conditioning conditions, and other reasons. A worker mostly works on the machines from the outside through a network, but works physically at places where the machines are located when, for example, replacing or adding a component. In this case, once the worker has entered the machine room to perform the work, for example, at the data center, the worker has access to machines of other companies in the machine room, which is a security problem.

In a known technique to maintain the security in the machine room, for example, at the data center, the server racks on which the machines are mounted are housed in a cage, for example, so as to physically prevent entry thereto. In another known technique, the machine room is divided into an area in which the worker is allowed to stay and a prohibited area in which the worker is not allowed to stay, so that position information of the worker can be managed and the existence of the worker in the prohibited area can be detected.

Patent Literature 1: Japanese Laid-open Patent Publication No. 2011-214844
Patent Literature 2: Japanese Laid-open Patent Publication No. 02-154357
Patent Literature 3: Japanese Laid-open Patent Publication No. 05-35407
Patent Literature 4: Japanese Laid-open Patent Publication No. 2013-149905

However, in the above techniques, the security can be maintained but with an adverse effect. For example, the server racks housed in the cage or the like prevent effective use of their installation areas and also hinder change of arrangement in the machine room. On the other hand, the technique of managing the position information of the worker can effectively use space in the machine room as compared to the method of physically dividing an area with a cage or the like, but needs extremely high installation cost.

SUMMARY

According to an aspect of an embodiment, a movement management device specifies, when a data center includes separated areas of a first area in which a server rack is installed and a second area in which a worker works, a worker who enters the second area. The movement management device specifies a target server rack to be operated by the specified worker from among a plurality of server racks installed in the first area. The movement management device moves the specified target server rack from the first area to the second area that the worker enters.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating exemplary information stored in a worker DB according to the first embodiment;
FIG. 6 is a diagram illustrating exemplary information stored in the work area DB according to the first embodiment;
FIG. 7 is a diagram illustrating exemplary information stored in an installation area DB according to the first embodiment;
FIG. 8 is a diagram illustrating exemplary information stored in a path DB according to the first embodiment;
FIG. 9 is a diagram illustrating exemplary information stored in a movement management DB according to the first embodiment;
FIG. 10 is a diagram illustrating exemplary information stored in a server rack DB according to the first embodiment.

DESCRIPTION OF EMBODIMENTS

Preferred Embodiments of the Present Invention will be explained with reference to accompanying drawings. The present embodiments are not intended to limit the disclosed technology. The embodiments described below may be combined as appropriate unless the combination causes inconsistency.

[a] First Embodiment
Configuration of Data Center

Figure 1:
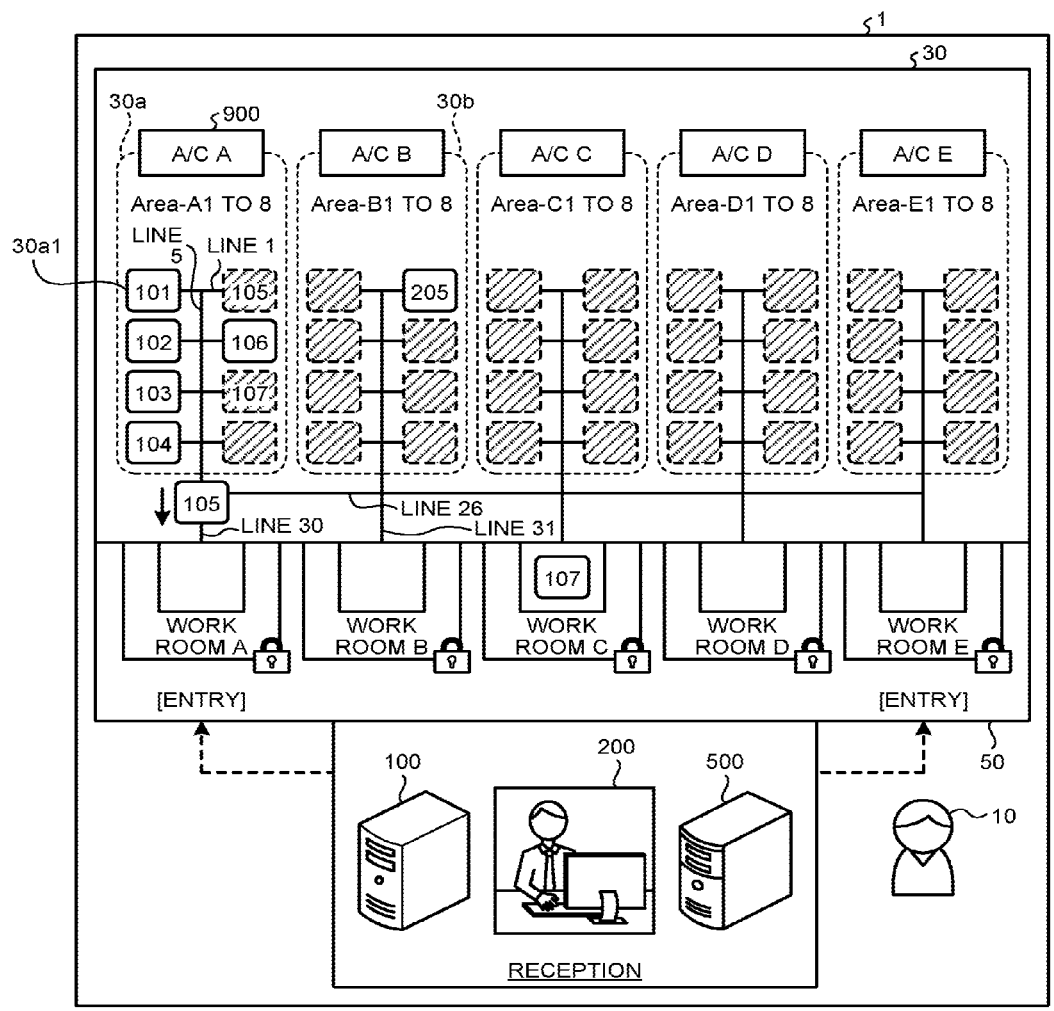
FIG. 1 is a diagram illustrating an exemplary data center according to a first embodiment.

FIG. 1 is a diagram illustrating an exemplary data center according to a first embodiment. As illustrated in FIG. 1, a data center 1 includes separated areas of an installation area 30 in which a plurality of server racks are installed and a work area 50 in which a worker 10 works on machines on the server racks. The installation area 30 is an exemplary first area, and the work area 50 is an exemplary second area.

The data center 1 also includes a management server 100, an administrator operating device 200, and a virtual server 500. The installation locations of the management server 100, the administrator operating device 200, and the virtual server 500 are not limited to an area separated from the installation area 30 and the work area 50 as illustrated in FIG. 1. The management server 100, the administrator operating device 200, and the virtual server 500 may be installed inside the installation area 30 or at a location other than the data center 1.

As illustrated in FIG. 1, the work area 50 includes a plurality of Work Rooms A to E in which the worker 10 works. Each work room is locked, and entry is allowed for the worker 10 who is successful in predetermined authentication processing upon an entry application. The work room is locked again when the worker 10 leaves. Although FIG. 1 illustrates an example in which the work area 50 includes a plurality of work rooms, the embodiment is not limited thereto, and the work area 50 may include only one work room. Hereinafter, Work Rooms A to E are collectively referred to as a work room in an indistinguishable manner.

As illustrated in FIG. 1, the installation area 30 is segmented into a plurality of air-conditioning zones indicated by, for example, the reference signs 30a and 30b in accordance with the target ranges of air-conditioning machines 900. As indicated by, for example, the reference sign 30a1, each segmented air-conditioning zone includes a plurality of installation locations, at each of which a single server rack is installed. Alternatively, the installation area 30 may have a configuration in which the installation area 30 is not segmented into a plurality of air-conditioning zones, or a configuration in which a single air-conditioning machine (hereinafter sometimes referred to as "A/C") 900 is provided to a single individual installation location.

In FIG. 1, each installation location illustrated by a white rectangle indicates that a server rack is installed at the installation location, and a number labeling the installation location indicates the rack number of the installed server rack. Each installation location illustrated by a hatched rectangle indicates an installation location at which no server rack is installed. For example, hatched installation locations labeled with rack numbers such as "105" and "107" in the air-conditioning zone 30a indicate that these server racks are moving for work and to be returned to these installation locations after the work is completed.

In the example illustrated in FIG. 1, in the air-conditioning zone indicated by the reference sign 30a, "Area-A1" denotes the left topmost part, "Area-A4" denotes the left bottommost part, "Area-A5" denotes the right topmost part, and "Area-A8" denotes the right bottommost part. For example, FIG. 1 illustrates that a server rack with the rack number "101" is installed at the installation location "Area-A1" and no server rack is currently installed at the installation location "Area-A8". FIG. 1 also illustrates that server racks installed at "Area-A5" and "Area-A7" are moving for work.

Having received a movement instruction from the management server 100, a server rack moves from the installation area 30 to a work room through lines. For example, Line 1 illustrated in FIG. 1 connects installation locations "Area-A1" and "Area-A5" with Line 5. Line 5 connects lines including Line 1 in the air-conditioning zone 30a with Line 26 and Line 30. Line 30 connects Line 5 and Line 26 with Work Room A.

In an initial state, all server racks are installed in the installation area 30, and all work rooms in the work area 50 are vacant. The example in FIG. 1 illustrates that a server rack with the rack number "107" has completed movement to "Work room C", and a server rack with the rack number "105" is moving to "Work Room A".

Figure 2:
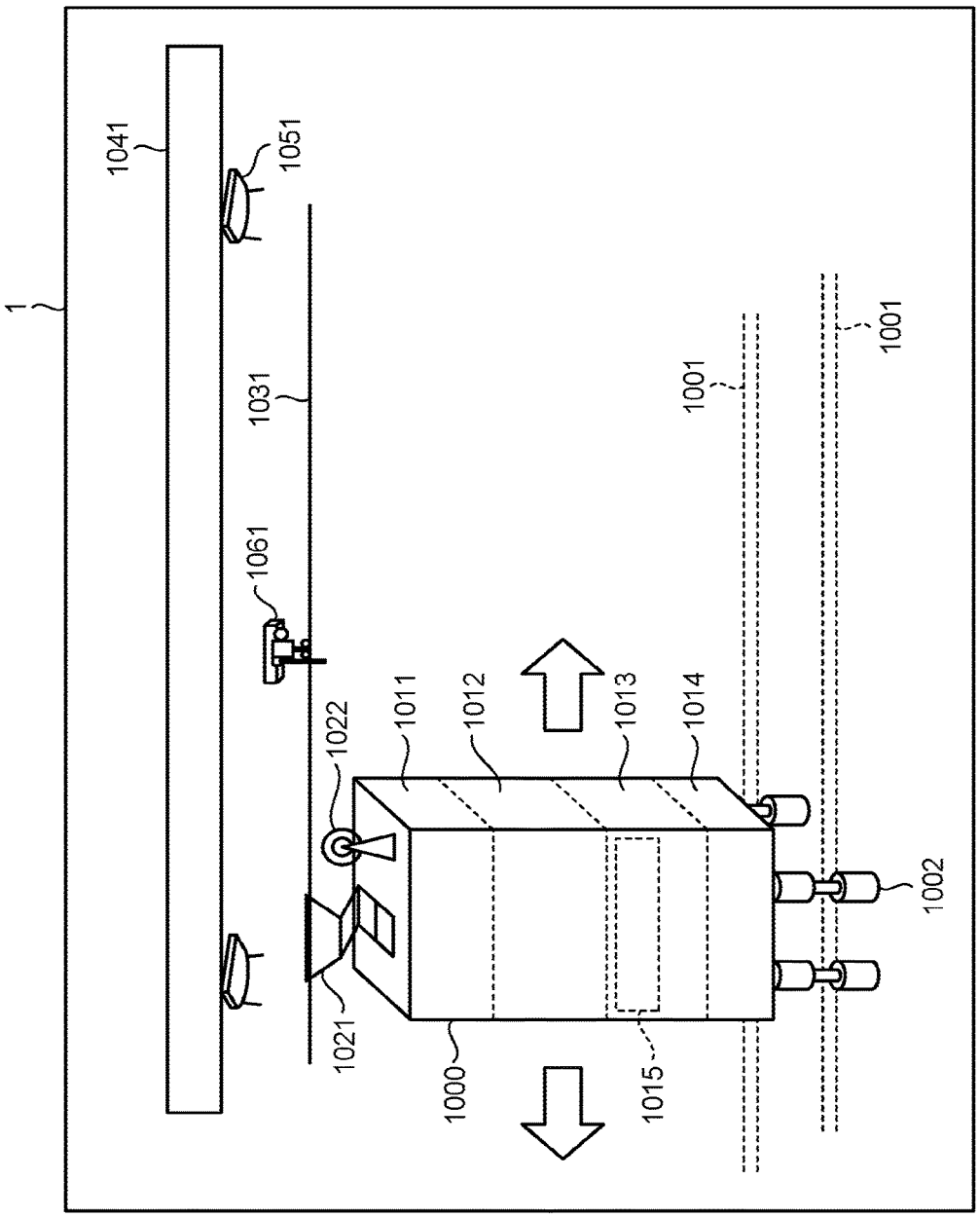
FIG. 2 is a diagram illustrating the exemplary data center and an exemplary server rack according to the first embodiment.

The movement of a server rack will be described in detail with reference to FIG. 2. FIG. 2 is a diagram illustrating an exemplary data center and an exemplary server rack according to the first embodiment. A server rack 1000 illustrated in FIG. 2 includes wheels 1002, an uninterruptible power source 1011, a dedicated A/C 1012, a machine mounting unit 1013, a drive control unit 1014, a power collecting device 1021, and a wireless device 1022. The machine mounting unit 1013 has a server machine 1015 mounted thereon. In the data center 1, a rail 1001 and a cable 1031 are laid along each line illustrated in FIG. 1, and an access point 1051 is installed on a ceiling 1041 of the data center 1.

Figure 3:
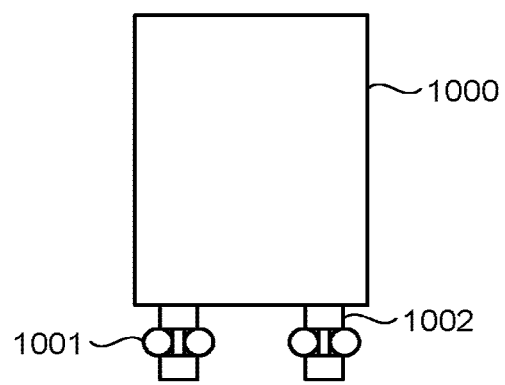
FIG. 3 is a diagram illustrating exemplary movement of the server rack according to the first embodiment.

The server rack 1000 travels on the rail 1001, moving between an installation location and a work room. FIG. 3 is a diagram illustrating exemplary movement of the server rack according to the first embodiment. The server rack 1000 is grounded on a pair of the rails 1001 installed in parallel through the wheels 1002, and is installed movable forward and backward on the rails 1001. The server rack 1000 is controlled in accordance with the movement instruction received by the drive control unit 1014 from the management server 100. The server rack 1000 is installed in such a manner that its movement direction can be changed at an intersection point of the rails 1001, or inside the installation location or the work room.

In FIG. 2, the machine mounting unit 1013 of the server rack 1000 can receive electrical power supply from the cable 1031 through the power collecting device 1021 such as a pantograph. The server rack 1000 includes the uninterruptible power source 1011 and the dedicated A/C 1012. The machine mounting unit 1013 can communicate with the access point 1051 through the wireless device 1022. With this configuration, the server rack 1000 can continuously operate the server machine 1015 while moving on the rail 1001. Once having completed movement into the installation location or the work room, the server rack 1000 may receive power supply through an electrical power line without using the power collecting device 1021 and the wireless device 1022, or may perform wired communication.

The management server 100 detects the position of the moving server rack 1000 by using, for example, a trolley contactor 1061 installed on the cable 1031 illustrated in FIG. 2. The trolley contactor 1061 is installed along the cable 1031 illustrated in FIG. 2, and configured to transmit a signal to the management server 100 upon a hit by the power collecting device 1021 when the server rack 1000 passes by. The management server 100 specifies the identification number of the server rack 1000 on a line along which the cable 1031 is laid based on the signal received from the trolley contactor 1061 and movement information on the server rack 1000 stored in a movement management DB 125 to be described later.

In the data center 1 as described above, the management server 100 specifies a worker entering a work area, and moves a target server rack to be operated by the specified worker to the work area. This configuration can prevent the worker 10 from accessing machines other than the server rack 1000 to be operated, thereby achieving improved security during work. In other words, in the data center separated into work rooms and areas in which a plurality of server racks are installed, the management server 100 moves, to a work room, only a server rack to be worked on by a system engineer (SE) who has entered the work room, so that improved security during work can be achieved.

Entire System Configuration

Figure 4:
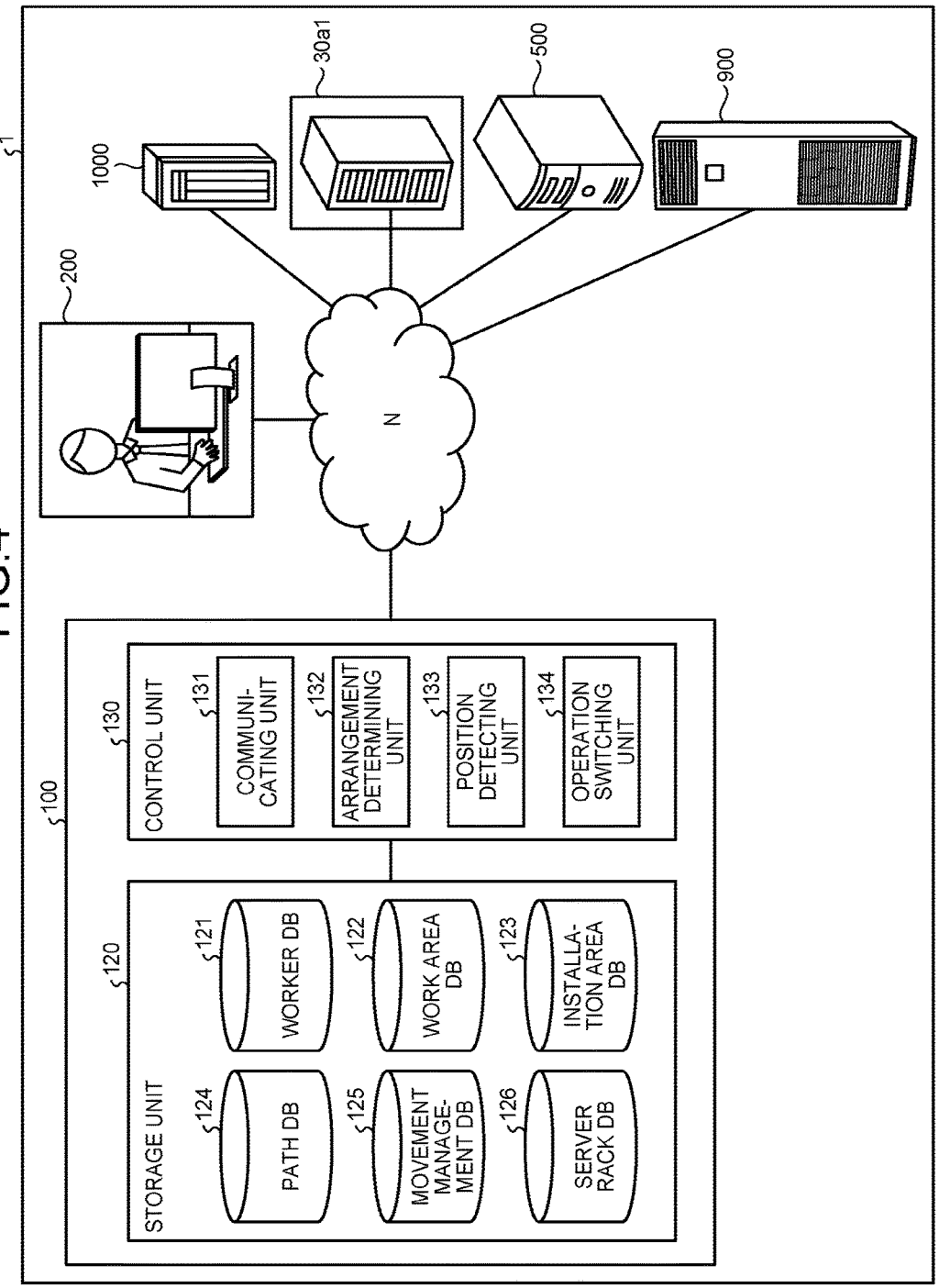
FIG. 4 is a functional block diagram illustrating an exemplary system according to the first embodiment.

The following describes a functional configuration of an implemented system in the present embodiment. FIG. 4 is a functional block diagram illustrating an exemplary system according to the first embodiment. As illustrated in FIG. 4, the system according to the present embodiment is installed in the data center 1, and includes the management server 100, the administrator operating device 200, the server rack 1000, the installation area 30a1, the virtual server 500, and the A/C 900. As illustrated in FIG. 1, the installation area 30a1 is exemplary, and a plurality of installation locations exist in the installation area 30. Although FIG. 4 illustrates the example in which each of these devices is a single device, the embodiment is not limited thereto, and a plurality of the devices may be provided.

The management server 100 is connected with the administrator operating device 200, the server rack 1000, the installation area 30a1, the virtual server 500, and the A/C 900 through a network N so as to perform mutual communication therebetween. The network N may be an optional kind of wired or wireless communication network such as the Internet, a local area network (LAN), or a virtual private network (VPN).

The management server 100 receives an instruction from the administrator operating device 200 or the worker 10 and transmits, to the server rack 1000 and the virtual server 500, instructions to, for example, move the server rack 1000 and back up the server machine 1015. The management server 100 detects the position of the server rack 1000, and receives information such as a temperature from the server rack 1000 and the installation area 30a1. The management server 100 instructs to move the server rack 1000 and control the A/C 900 based on the detected position of the server rack 1000 and the received information such as the temperature.

Upon reception of an instruction from an administrator, the administrator operating device 200 transmits, for example, an entry application to the management server 100, and presents information received from the management server 100 to the administrator. The administrator operating device 200 also receives an instruction from the administrator, and updates various DBs of the management server 100.

The server rack 1000 moves between the installation area 30 and the work area 50 based on an instruction from the management server 100. Upon movement, the server machine 1015 mounted on the server rack 1000 performs shut down, restart, backup and recovery of stored data, and operation switching to the virtual server 500 based on an instruction from the management server 100.

The installation area 30a1 includes a temperature measuring unit and a communication unit, which are not illustrated, and transmits information such as a measured temperature at the installation location to the management server 100. The virtual server 500 receives the backup and the operation switching from the server machine 1015 based on an instruction from the management server 100, when the server rack 1000 moves. The A/C 900 controls air conditioning in the air-conditioning zone based on an instruction from the management server 100.

Functional Configuration of Management Server

The following describes a functional configuration of the management server 100. As illustrated in FIG. 4, the management server 100 includes a storage unit 120 and a control unit 130. The management server 100 may include various functional components such as various input devices and sound output devices included in a known computer in addition to functional components illustrated in FIG. 4.

Next, each functional block of the management server 100 will be described. The storage unit 120 is, for example, a semiconductor memory element such as a random access memory (RAM) or a flash memory, or a storage device such as a hard disk or an optical disk. The storage unit 120 includes a worker DB 121, a work area DB 122, an installation area DB 123, a path DB 124, the movement management DB 125, and a server rack DB 126. The storage unit 120 stores therein various kinds of information used in processing by the control unit 130.

The worker DB 121 stores therein information on the worker 10 working on the server rack 1000. FIG. 5 is a diagram illustrating exemplary information stored in the worker DB according to the first embodiment. As illustrated in FIG. 5, the worker DB 121 stores therein "Company Name and Department Name", "Name of Person in Charge", and "Rack No." in association with "Worker ID". In the example in FIG. 5, for example, the server rack 1000 with the rack number "105" is associated with the worker 10 having the worker ID "U0001". The content of the worker DB 121 is updated based on, for example, an instruction input from the administrator operating device 200.

The worker DB 121 may store therein a plurality of worker IDs in association with a single rack number, which indicates that a plurality of workers 10 work on a single server rack 1000. The worker DB 121 may store therein one worker ID in association with a plurality of rack numbers, which indicates that a single worker 10 manages a plurality of server racks 1000.

In FIG. 4, the work area DB 122 stores therein the condition of a work room in the work area 50. FIG. 6 is a diagram illustrating exemplary information stored in the work area DB according to the first embodiment. As illustrated in FIG. 6, the work area DB 122 stores therein "Rack No." and "Expected Work Completion Time" in association with "Work room ID". The content of the work area DB 122 is updated based on, for example, an instruction from an arrangement determining unit 132.

In the example in FIG. 6, a "Rack No." cell indicates the server rack 1000 being worked on in the corresponding work room. A cell with the rack number "empty" indicates that the corresponding work room is vacant with no server rack 1000 therein. An "Expected Work Completion Time" cell indicates an expected completion time of work on the server rack 1000 in the corresponding work room. For example, in the work area DB 122, a record with the work room ID "Work room C" indicates that the server rack 1000 with the rack number "107" is being worked on, and the work is expected to be completed at "13:30:00".

In FIG. 4, the installation area DB 123 stores therein the condition of each installation location in the installation area 30. FIG. 7 is a diagram illustrating exemplary information stored in the installation area DB according to the first embodiment. As illustrated in FIG. 7, the installation area DB 123 stores therein "Rack No.", "Measured Temperature", and "Controlling A/C" in association with "Installation location ID". The content of the installation area DB 123 is updated based on, for example, an instruction from the arrangement determining unit 132.

In the example in FIG. 7, a "Rack No." cell indicates the server rack 1000 installed at the corresponding installation location. A cell with the rack number "empty" indicates that the corresponding work room is vacant with no server rack 1000 therein. A cell with the rack number "temp" indicates that the corresponding work room is temporarily vacant because a server rack is moving.

A "Measured Temperature" cell indicates a temperature measured at the corresponding installation location. Additionally, environmental information other than the temperature may be stored. A "Controlling A/C" cell indicates the ID of an A/C controlling air conditioning at the corresponding installation location. In the example in FIG. 7, the installation area DB 123 stores therein information that the server rack 1000 with the rack number "101" is installed at an installation location with the installation location ID "Area-A1". The stored information also indicates that the measured temperature at the corresponding installation location is "23.5° C." and the controlling A/C is "A/C A". In the example in FIG. 7, eight installation locations "Area-A1" to "Area-A8" are included in the air-conditioning zone 30a the controlling A/C of which is "A/C A".

In FIG. 4, the path DB 124 stores therein a path on which the server rack 1000 moves between the installation location and the work area. FIG. 8 is a diagram illustrating exemplary information stored in the path DB according to the first embodiment. As illustrated in FIG. 8, the path DB 124 stores therein "Movement Origin", "Movement Destination", "Movement Route", and "Normal Movement Time" in association with "Management Number". The content of the path DB 124 is updated based on, for example, an instruction input from the administrator operating device 200.

In the example in FIG. 8, a "Movement Route" cell stores therein all lines passed by the server rack 1000 moving from "Movement Origin" to "Movement Destination". A "Normal Movement Time" cell stores therein a typical movement time taken by the server rack 1000 moving from "Movement Origin" to "Movement Destination". "Movement Origin" and "Movement Destination" stored in the path DB 124 may be an installation location and a work room as illustrated in FIG. 8, and a line. For example, the path DB 124 stores therein information that the server rack 1000 moving from "Area-A1" to "Work Room A" passes through "Line 1", "Line 5", and "Line 30" typically in "16 minutes 0 seconds".

In FIG. 4, the movement management DB 125 stores therein a movement condition of the server rack 1000. FIG. 9 is a diagram illustrating exemplary information stored in the movement management DB according to the first embodiment. As illustrated in FIG. 9, the movement management DB 125 stores therein "Movement Origin", "Movement Destination", "Current Position", and "Expected Movement Completion Time" in association with "Rack No.". The content of the movement management DB 125 is updated based on, for example, an instruction from the arrangement determining unit 132.

In the example in FIG. 9, "Movement Origin", "Movement Destination", and "Current Position" cells store therein information on from where to where the server rack 1000 with the corresponding rack number is moving and where the server rack 1000 currently is. An "Expected Movement Completion Time" cell indicates an expected time at which the corresponding server rack 1000 completes movement. Identical entries in the "Movement Destination" and "Current Position" cells indicate that the corresponding server rack 1000 has already completed movement, and thus the "Expected Movement Completion Time" cell stores therein "Movement Completed".

For example, in the movement management DB 125, a record with the rack number "105" stores therein information that the server rack 1000 with the rack number "105" is moving from "Area-A5" to "Work Room A". This record also stores therein information that the server rack 1000 with the rack number "105" is expected to complete moving at "13:00:00". Information on the server rack 1000 that has already completed movement, such as that indicated by the rack number "107" in FIG. 9, may be stored in a DB other than the movement management DB 125.

In FIG. 4, the server rack DB 126 stores therein the setting and condition of the server rack 1000. FIG. 10 is a diagram illustrating exemplary information stored in the server rack DB according to the first embodiment. As illustrated in FIG. 10, the server rack DB 126 stores therein "Installation location ID", "Generated Heat Amount", "Backup", and "Stop Machine During Work" in association with "Rack No.". The content of the server rack DB 126 is updated based on, for example, an instruction from an operation switching unit 134.

In the example in FIG. 10, a "Generated Heat Amount" cell indicates a generated heat amount of the corresponding server rack 1000. The "Generated Heat Amount" cell stores therein, for example, a generated heat amount as the sum of designed values of generated heat amounts of the server machine 1015 and other machines mounted on the corresponding server rack 1000. "Backup" and "Stop Machine During Work" cells store therein information on whether to perform backup of data stored in the server machine 1015 and whether to stop the server machine 1015, respectively, when the corresponding server rack 1000 is moved. For example, the "Backup" cell stores therein "Y" to indicate that backup is perform before the server rack 1000 moves, and the "Stop Machine During Work" cell stores therein "N" to indicate that the server machine 1015 is not to be stopped while being worked on.

For example, the server rack DB 126 illustrated in FIG. 10 stores therein information indicating that the server rack 1000 with the rack number "101" has a generated heat amount of "420 kJ/h" and is to be backed up while being worked on, and the server machine 1015 is not to be stopped while being worked on. "Backup" and "Stop Machine During Work" cells may store therein the timing of backup and the duration of stopping the server machine 1015 in detail, for example, information that "the server machine 1015 is to be stopped while moving and to be restarted after arriving at a work room". The server rack DB 126 may further store therein information on whether to switch the operation to the virtual server 500 in addition to information on whether to perform backup of data stored in the server machine 1015.

In FIG. 4, the control unit 130 is achieved by, for example, a CPU and a microprocessing unit (MPU) executing a computer program stored in a built-in storage device by using a RAM as a work area. Alternatively, the control unit 130 may be achieved by, for example, integrated circuits such as an application specific integrated circuit (ASIC) and a field programmable gate array (FPGA).

The control unit 130 includes a communicating unit 131, the arrangement determining unit 132, a position detecting unit 133, and the operation switching unit 134, so as to achieve or execute the functionality and effect of information processing to be described below. The internal configuration of the control unit 130 is not limited to the configuration illustrated in FIG. 4, but may be any other configuration for performing the information processing to be described later. The communicating unit 131, the arrangement determining unit 132, the position detecting unit 133, and the operation switching unit 134 are each an exemplary electronic circuit such as a processor or an exemplary process executed by, for example, a processor.

The communicating unit 131 is a processing unit configured to receive, for example, an entry application from the administrator operating device 200 and the worker 10, and transmit instructions such as movement and backup instructions to, for example, the server rack 1000 and the virtual server 500. Specifically, having received an entry application from, for example, the administrator operating device 200, the communicating unit 131 outputs information such as the ID and full name of a worker to the arrangement determining unit 132. The communicating unit 131 transmits an instruction related to the movement of the server rack 1000, which is input from the arrangement determining unit 132, to the server rack 1000. The communicating unit 131 transmits an instruction related to, for example, the backup of the virtual server 500, which is input from the operation switching unit 134, to the server rack 1000 and the virtual server 500.

The arrangement determining unit 132 is a processing unit configured to specify the worker 10 and the server rack 1000 and allocate a work room. Specifically, the arrangement determining unit 132 specifies the worker 10 and the server rack 1000 by referring to the worker DB 121 based on, for example, information on the worker input from the communicating unit 131. The arrangement determining unit 132 allocates a work room to the worker 10 by referring to the work area DB 122.

Having received, for example, "Mr. AAA" of "AAA Co., Ltd." in an entry application, the arrangement determining unit 132 specifies the worker ID "U0001" by referring to the worker DB 121. The arrangement determining unit 132 also specifies the rack number "105" associated with this worker ID by referring to the worker DB 121. The entry application can be achieved by, for example, a configuration in which the administrator operating device 200 reads in a worker certificate storing therein a worker ID, or a configuration in which the worker 10 inputs a full name to the administrator operating device 200. When a work start time is allocated for the worker 10 in advance, the arrangement determining unit 132 specifies the worker 10 at this work start time by referring to, for example, a database in which the worker 10 is associated with the work start time.

Next, the arrangement determining unit 132 specifies Work Room A with the rack number "empty" by referring to the work area DB 122, and outputs an instruction related to the entry of the worker 10 and the movement of the server rack 1000 to the communicating unit 131. The arrangement determining unit 132 updates the rack number "105" to "temp" in the installation area DB 123, for example, at a timing when the server rack 1000 with the rack number "105" starts movement or has completed movement.

When the server rack 1000 with the rack number "105" has completed movement to Work Room A, the arrangement determining unit 132 updates the rack number cell of a record of Work Room A in the work area DB 122 from "empty" to "105". When a time taken for work is specified in an entry application, this time is used with the entry time of the worker 10 or the movement completion time of the server rack 1000 to calculate an expected work completion time and update the "Expected Work Completion Time" cell in the work area DB 122.

When the worker 10 has completed work on the server rack 1000 and the management server 100 has detected leaving of the worker 10, the arrangement determining unit 132 specifies an installation location as a return destination of the server rack 1000 by referring to the server rack DB 126. The leaving of the worker 10 is detected upon, for example, transmission of a notification by the worker 10 or an operation by an administrator, but the embodiment is not limited thereto. For example, leaving may be detected by performing authentication processing again when the worker 10 leaves the work room.

Thereafter, the arrangement determining unit 132 outputs an instruction for the server rack 1000 to the communicating unit 131. For example, in the above-described processing, the arrangement determining unit 132 outputs a movement instruction for a return to the installation location "Area-A5" to the server rack 1000 with the rack number "105" that was moved to Work Room A.

The position detecting unit 133 is a processing unit configured to detect the current position of the server rack 1000 and update the movement management DB 125. Specifically, having received a signal from the trolley contactor 1061 through the communicating unit 131, the position detecting unit 133 specifies the server rack 1000 having hit the corresponding trolley contactor 1061 by referring to the movement management DB 125.

The following describes an example in which the position detecting unit 133 has received a signal from the trolley contactor 1061 in Work Room A. The position detecting unit 133 specifies, by referring to the movement management DB 125 illustrated in FIG. 9, that only the server rack 1000 with the rack number "105" currently at a position on "Line 30" is movable to Work Room A. In this case, the position detecting unit 133 updates the "Current Position" cell with "Work Room A" and the "Expected Movement Completion Time" cell with "Movement Completed" in the record with the rack number "105" in the movement management DB 125.

When a plurality of server racks 1000 are moving, the position detecting unit 133 detects the current position of each server rack 1000 and updates the movement management DB 125 accordingly. The position detecting unit 133 also cooperates with the arrangement determining unit 132 so as to specify the movement path of a certain server rack 1000 and determine whether any other server rack 1000 exists on the specified movement path by referring to the movement management DB 125. If any other server rack 1000 exists on the specified movement path, the position detecting unit 133 instructs, in cooperation with the arrangement determining unit 132, the specified server rack 1000 to stop moving or retract off the path until the other server rack 1000 leaves the movement path.

For example, the movement management DB 125 stores therein "Line 5" as the current position of a particular server rack 1000 and "Work room B" as the movement destination thereof. In this case, the position detecting unit 133 cooperates with the arrangement determining unit 132 so as to specify the movement path of the particular server rack 1000 by referring to the path DB 124 illustrated in FIG. 8. As illustrated in FIG. 1, the particular server rack 1000 moves to Work Room B through Lines 26 and 31. In this case, the position detecting unit 133 searches for a record with the current position "Line 26" or "Line 31" by referring to the movement management DB 125.

If a relevant record is found, the movement management DB 125 determines that another server rack 1000 exists on the movement path of the particular server rack 1000. In this case, the arrangement determining unit 132 instructs the particular server rack 1000 to stop moving or retract off the path.

In FIG. 4, the operation switching unit 134 is a processing unit configured to manage the backup, operation switching, and stopping of the server machine 1015. Specifically, upon an entry application or a leaving notification, the operation switching unit 134 determines whether to perform backup, operation switching, or stopping during a movement for the server rack 1000 by referring to the server rack DB 126. The operation switching unit 134 outputs, to the communicating unit 131 based on a result of the determination, instructions for the server rack 1000 and the virtual server 500, which are related to backup of data stored in the server machine 1015 and stopping of the server machine 1015 during work. In the following, the backup, the operation switching, and the stopping during work are collectively referred to as the backup and the like.

The following describes an example in which the server rack with the rack number "105" is specified as the server rack 1000. The operation switching unit 134 specifies, by referring to the server rack DB 126, that data stored in the server machine 1015 is to be backed up before work on the server rack 1000 with the rack number "105", and the server machine 1015 is to be stopped during the work. Next, the operation switching unit 134 outputs, to the server rack 1000 and the virtual server 500 based on a specified result, instructions to start the backup and stop the server machine 1015.

Having received an input related to the necessity of backup or the necessity of stopping the machine worked on from the communicating unit 131 in an entry application or an optional timing, the operation switching unit 134 updates the server rack DB 126. For example, if a "Backup" cell in the server rack DB 126 stores therein "N", the operation switching unit 134 updates the "Backup" cell with "Y" in the server rack DB 126 upon an entry application including a backup instruction. The operation switching unit 134 instructs backup of data stored in the server machine 1015 to the server rack 1000 and the virtual server 500 based on the updated server rack DB 126.

Entire Process

Figure 11:
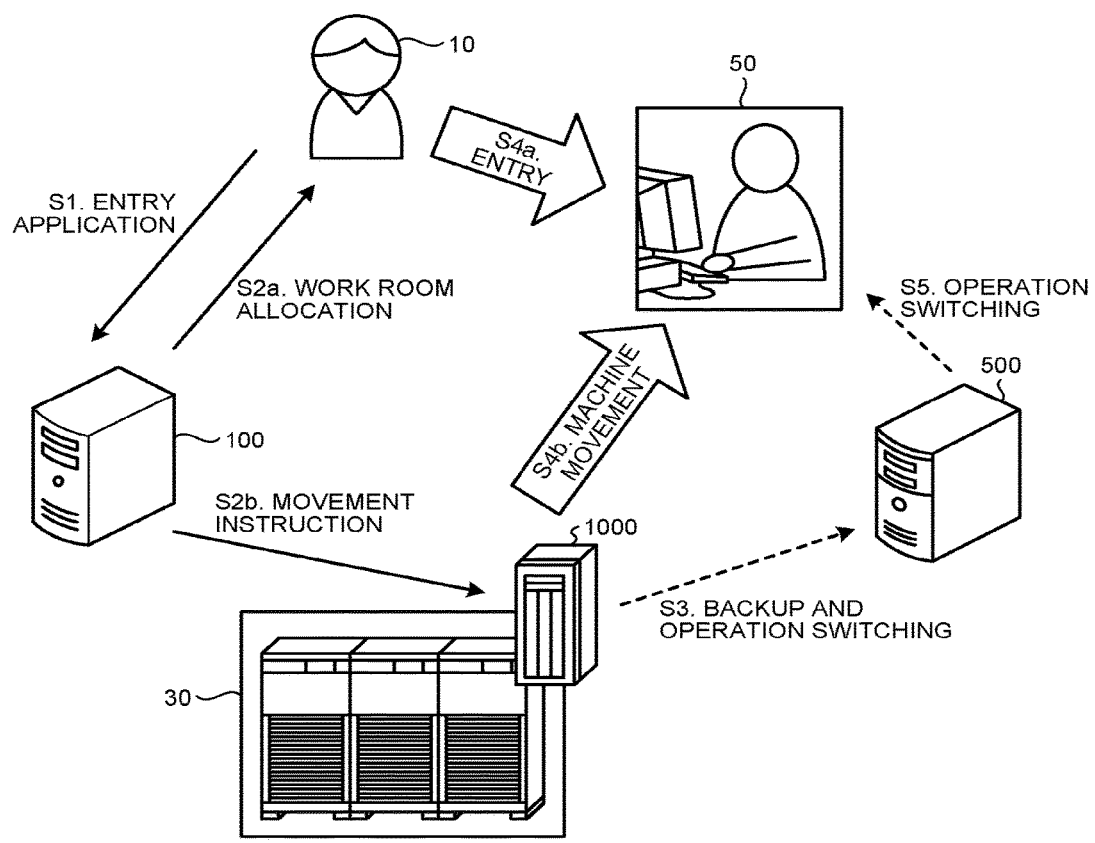
FIG. 11 is a schematic diagram illustrating an exemplary entry process according to the first embodiment.
Figure 12:
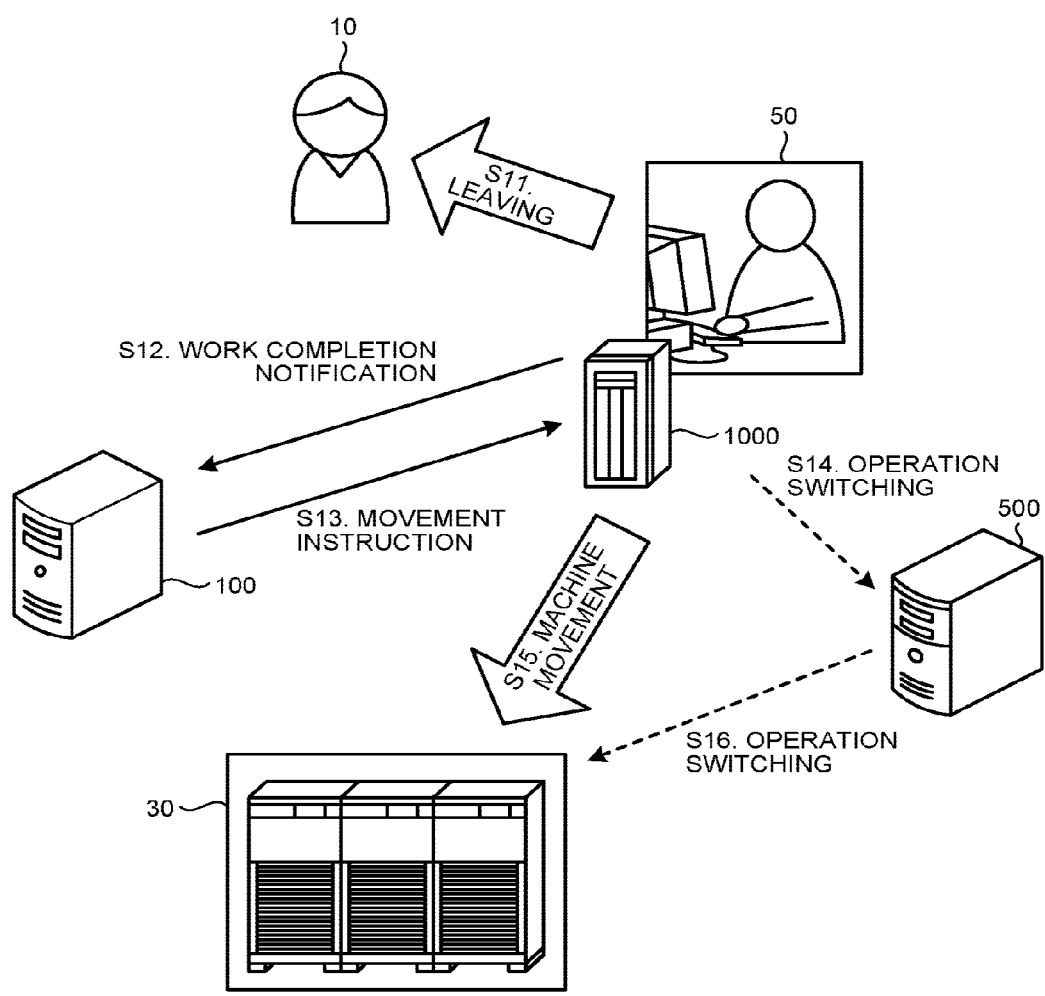
FIG. 12 is a schematic diagram illustrating an exemplary leaving process according to the first embodiment.

The following describes the entire process according to the present embodiment with reference to FIGS. 11 and 12. FIG. 11 is a schematic diagram illustrating an exemplary entry process according to the first embodiment. In FIGS. 11 and 12, a number represents an execution order of processing, and sub numbers with the same number, such as 2*a* and 2*b*, represent processing executed simultaneously or in parallel. A block arrow represents a physical movement of the worker 10 or a server rack, and a line arrow represents a data flow. Of the line arrows, a dashed line arrow represents processing executed in response to an individual instruction from the worker 10 or the administrator.

The management server 100, the installation area 30, the work area 50, the server rack 1000, and the virtual server 500 illustrated in FIG. 11 are installed in the data center 1 illustrated in FIG. 1. The worker 10 works on the server rack 1000 in the work area 50 of the data center 1.

First, as illustrated in FIG. 11, the worker 10 who intends to work on the server rack 1000 applies for entry into the work area 50 to the administrator in advance or at a desired timing for the work (step S1). The entry application may be performed in such a manner that the worker 10 applies to the administrator of the management server 100 and the administrator inputs the content of the application to the management server 100. Alternatively, the worker 10 may directly transmit the content of the application to the management server 100. The content of the entry application may additionally include specifications of, for example, the identification number of the server rack 1000, the necessities of operation stop and backup of the server machine 1015 stored in the server rack 1000, and a time expected for the work. The reception of the application from the worker 10 may be replaced with a configuration in which the management server 100 allocates a work start time to the worker 10 in advance, so that the worker 10 will be called in at the specified time.

The management server 100 specifies identification information and the like of the worker 10 having submitted the entry application, and allocates a work room in the work area 50 to the worker 10 (step S2*a*). The management server 100 also specifies the server rack 1000 corresponding to the identification information of the worker 10 and transmits, to the corresponding server rack 1000, an instruction to move to the allocated work room (step S2*b*). If the backup and the like of the server machine 1015 of the server rack 1000 are to be performed, the management server 100 transmits instructions thereof to the server rack 1000 and the virtual server 500. Alternatively, a plurality of server racks 1000 may be specified when, for example, the worker 10 works on a plurality of server racks at once.

Having received the instructions, the server rack 1000 backs up data stored in the server machine 1015 to the virtual server 500 and switches the operation to the virtual server 500 (step S3), and then shuts down the server machine 1015 and starts moving to the work room (step S4*b*). When the server rack 1000 has completed movement to the work room and restarted the server machine 1015, the virtual server 500 recovers the backed up data at the server machine 1015, and switches the operation back to the server machine 1015 (step S5). If the backup and the like are not to be performed, the movement may be performed without the processing at step S3 and step S5. Alternatively, instead of the processing at step S5, the operation may be switched to the server machine 1015 of the server rack 1000 to restart the server machine 1015 after the server rack 1000 has returned to the installation area 30. Alternatively, as described with reference to FIG. 2, the server rack 1000 may move while keeping the server machine 1015 operational.

The worker 10 enters the allocated work room (step S4*a*) and works on the server machine 1015 of the server rack 1000 that was moved to the work room. The management server 100 may communicate with the work room to execute predetermined authentication processing at the entry.

The following describes processing when the work in the work room is completed. FIG. 12 is a schematic diagram illustrating an exemplary leaving process according to the first embodiment. First, if the worker 10 leaves the work room (step S11), a work completion notification is transmitted from the work area 50 to the management server 100 (step S12). Alternatively, the worker 10 may notify the administrator of the management server 100 of work completion, so that the administrator will input the work completion to the management server 100. Alternatively, the leaving of the worker 10 may be determined when a predetermined time has passed after the worker 10 entered the room, and the work completion notification may be automatically transmitted. The work room may be automatically locked when the worker 10 leaves.

Having received the input of work completion, the management server 100 instructs the server rack 1000 in the work room to return to the installation area 30 (step S13). In this processing, the management server 100 may read out a previously set installation location of the corresponding server rack 1000 or may set an installation location at each movement instruction. Similarly to the entry processing, the operation may be switched to the virtual server 500 to shut down the server machine 1015 of the server rack 1000 while the server rack 1000 is moving (step S14).

Thereafter, having received the instruction, the server rack 1000 moves to the set installation location in the installation area 30 (step S15). If the operation has been switched to the virtual server 500, the server machine 1015 of the server rack 1000 is stared after the server rack 1000 has completed movement, followed by the switching of the operation from the virtual server 500 back to the server machine 1015 of the server rack 1000 (step S16).

Process of Entry Processing at Management Server

Figure 13:
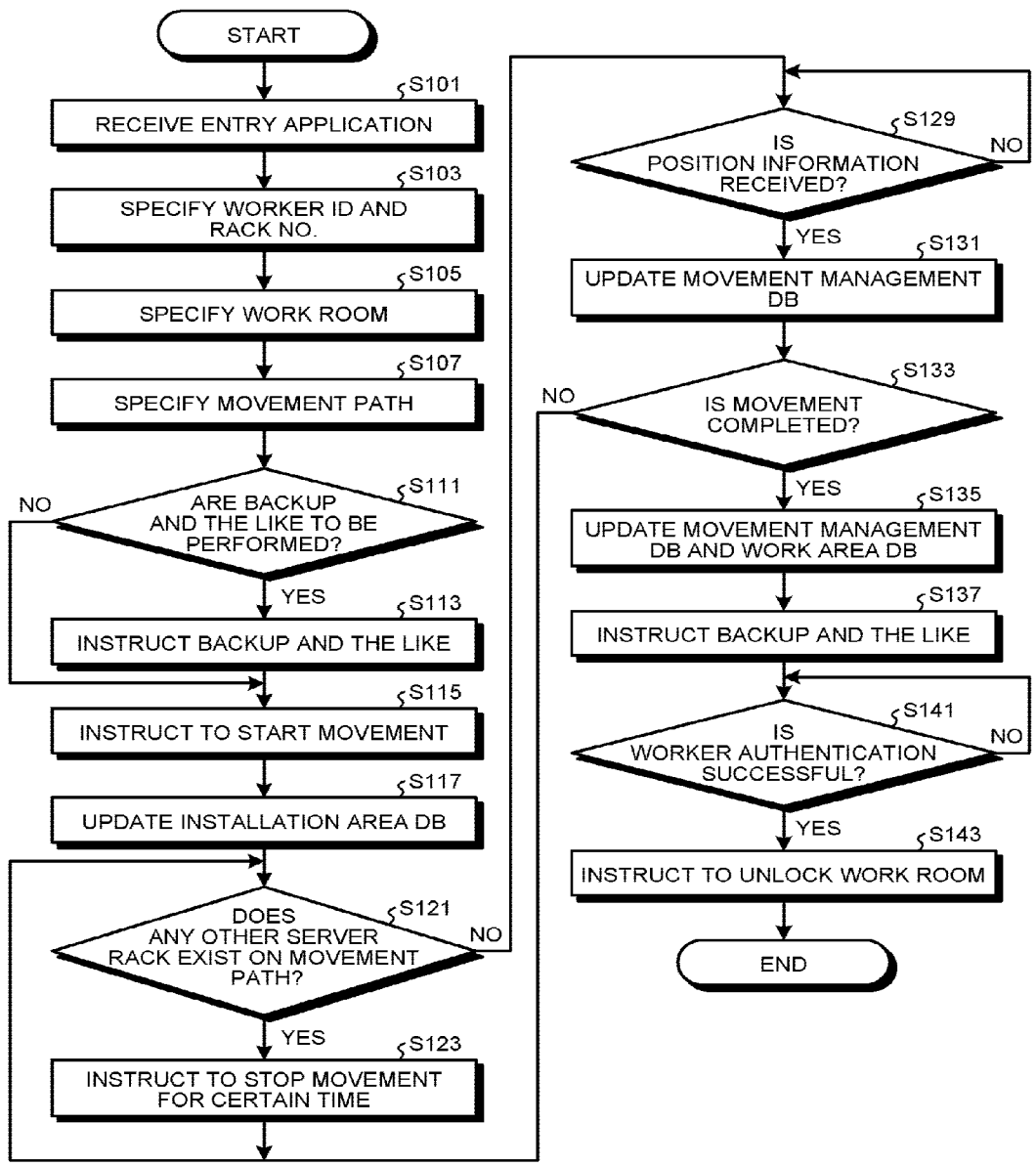
FIG. 13 is a flowchart of exemplary entry processing according to the first embodiment.

The following describes the process of processing by the management server 100 in the above-described entire process. In the present embodiment, the processing by the management server 100 includes the entry processing and the leaving processing. FIG. 13 is a flowchart of exemplary entry processing according to the first embodiment. First, the communicating unit 131 of the management server 100 receives an entry application from the administrator operating device 200 or the worker 10 (step S101). Next, the arrangement determining unit 132 specifies a worker ID and a rack number related to the entry application by referring to the worker DB 121 based on an instruction output from the communicating unit 131 (step S103).

Next, the arrangement determining unit 132 specifies the work room corresponding to the specified worker 10 and the server rack 1000 by referring to the work area DB 122 (step S105). The arrangement determining unit 132 also specifies, by referring to the path DB 124, a movement path to the work room specified based on the installation location of the server rack 1000 (step S107).

Next, the operation switching unit 134 determines, by referring to the server rack DB 126, whether to perform the backup and the like when the server rack 1000 moves (step S111). If the backup and the like is to be performed (Yes at step S111), the operation switching unit 134 instructs, through the communicating unit 131, to the server rack 1000 and the virtual server 500 to perform the backup and the like (step S113). If the backup and the like is not to be performed (No at step S111), the process proceeds to step S115.

Next, the arrangement determining unit 132 instructs, through the communicating unit 131, the server rack 1000 to move to the specified work room (step S115). The arrangement determining unit 132 also updates the rack number of a record corresponding to the server rack 1000 in the installation area DB 123 with "temp" (step S117).

Next, the position detecting unit 133 determines, by referring to the movement management DB 125, whether any other server rack 1000 exists on the movement path of the server rack 1000 (step S121). If any other server rack 1000 exists on the movement path (Yes at step S121), the arrangement determining unit 132 instructs, through the communicating unit 131, the server rack 1000 to stop movement for a certain time (step S123). Thereafter, the process returns to step S121.

If no other server rack 1000 exists on the movement path (No at step S121), the position detecting unit 133 waits for reception of the position information of the server rack 1000 through the communicating unit 131 (No at step S129). If the position information of the server rack 1000 is received (Yes at step S129), the position detecting unit 133 updates the current position in the movement management DB 125 with the received position information (step S131).

Next, the position detecting unit 133 determines whether the server rack 1000 has completed movement to the work room (step S133). If the movement is yet to be completed (No at step S133), the process returns to step S121. If the movement is completed (Yes at step S133), the position detecting unit 133 updates the rack number cell in the work area DB 122 with the rack number of the server rack 1000. The position detecting unit 133 also updates the expected movement completion time in the movement management DB 125 with "Movement Completed" (step S135). Thereafter, the arrangement determining unit 132 instructs the server rack 1000 and the virtual server 500 to perform the operation switching, the backup recovery, the start of the server machine 1015, and the like (step S137).

Next, the arrangement determining unit 132 waits for successful authentication processing of the worker 10 in the work room (No at step S141). Upon successful authentication processing (Yes at step S141), the arrangement determining unit 132 instructs unlocking of the work room (step S143), and then ends the process.

The worker 10 is subjected to predetermined authentication processing in parallel to the above-described processing process, and enters the specified work room to start work on the server rack 1000. The position detecting unit 133 receives the position information of any server rack 1000 other than this server rack 1000 from the other server rack 1000 or the trolley contactor 1061 through the communicating unit 131. Having detected that any other server rack 1000 moves onto the movement path, the arrangement determining unit 132 may instruct the server rack 1000 to stop moving even before the server rack 1000 moves onto the next line.

Process of Leaving Processing at Management Server

Figure 14:
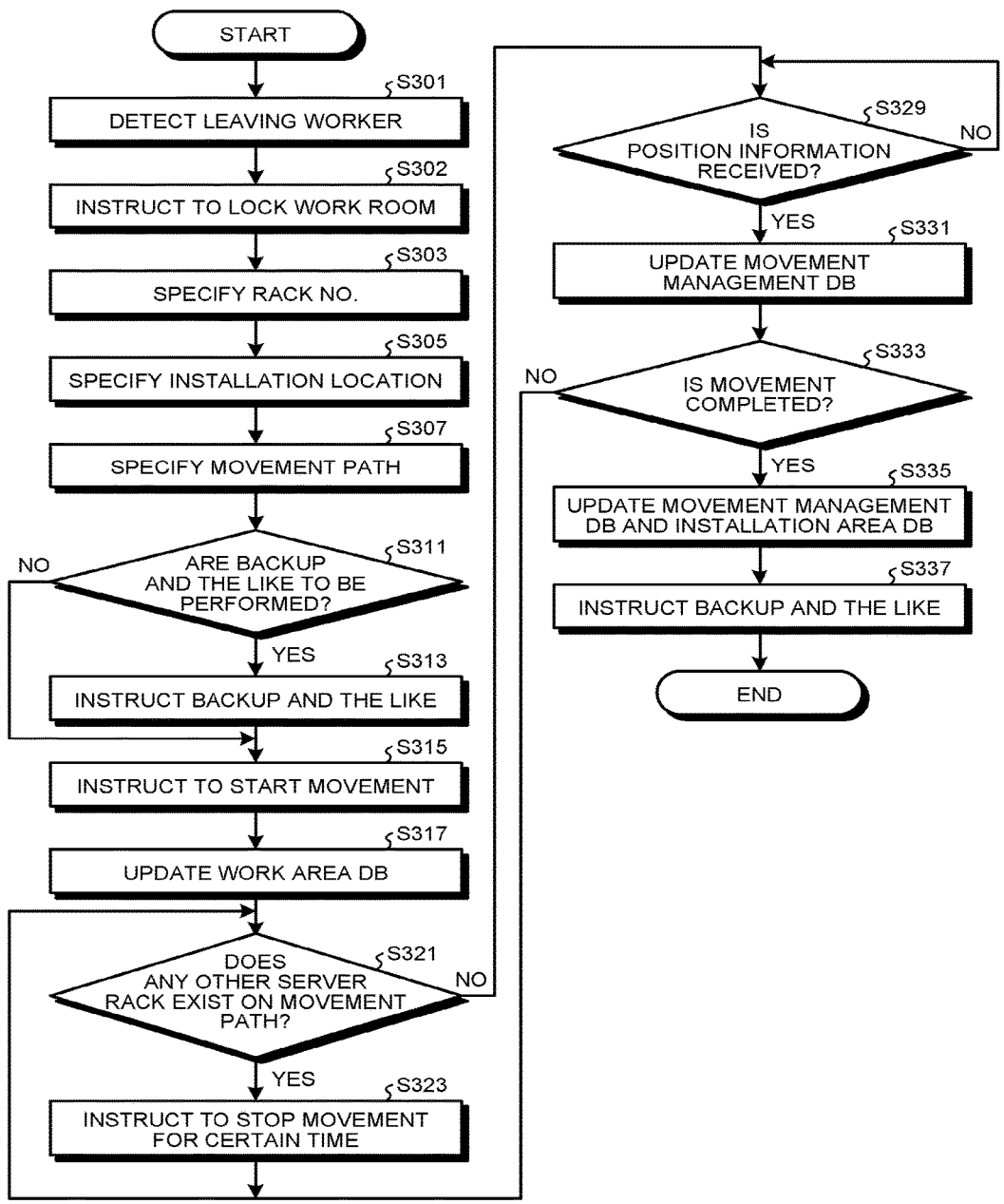
FIG. 14 is a flowchart of exemplary leaving processing according to the first embodiment.

The following describes the process of the leaving processing with reference to FIG. 14. FIG. 14 is a flowchart of exemplary leaving processing according to the first embodiment. First, having detected that the worker 10 leaves a work room (step S301), the communicating unit 131 of the management server 100 transmits an instruction to lock the work room (step S302). Next, the arrangement determining unit 132 specifies the rack number of the server rack 1000 by referring to the work area DB 122 (step S303).

Next, the arrangement determining unit 132 specifies the installation location corresponding to the server rack 1000 by referring to the server rack DB 126 (step S305). The arrangement determining unit 132 also specifies a movement path from the work room to the specified installation location of the server rack 1000 by referring to the path DB 124 (step S307).

Next, the operation switching unit 134 determines whether to perform the backup and the like when the server rack 1000 moves by referring to the server rack DB 126 (step S311). If the backup and the like is to be performed (Yes at step S311), the operation switching unit 134 instructs, through the communicating unit 131, the server rack 1000 and the virtual server 500 to perform the backup and the like (step S313). If the backup and the like is not to be performed (No at step S311), the process proceeds to step S315.

Next, the arrangement determining unit 132 instructs, through the communicating unit 131, the server rack 1000 to move to the specified installation location (step S315). The arrangement determining unit 132 also updates the rack number cell in the work area DB 122 with "empty" (step S317).

Next, the position detecting unit 133 determines whether any other server rack 1000 exists on the movement path of the server rack 1000 by referring to the movement management DB 125 (step S321). If any other server rack 1000 exists on the movement path (Yes at step S321), the arrangement determining unit 132 instructs, through the communicating unit 131, the server rack 1000 to stop moving for a certain time (step S323). Thereafter, the process returns to step S321.

If no other server rack 1000 exists on the movement path (No at step S321), the position detecting unit 133 waits for reception of the position information of the server rack 1000 through the communicating unit 131 (No at step S329). If the position information of the server rack 1000 is received (Yes at step S329), the position detecting unit 133 updates the current position cell in the movement management DB 125 with the received position information (step S331).

Next, the position detecting unit 133 determines whether the server rack 1000 has completed movement to the installation location (step S333). If the movement of the server rack 1000 is yet to be completed (No at step S333), the process returns to step S321. If the movement of the server rack 1000 is completed (Yes at step S333), the position detecting unit 133 updates the rack number cell in the installation area DB 123 with the rack number of the server rack 1000. The position detecting unit 133 also updates the expected movement completion time cell in the movement management DB 125 with "Movement Completed" (step S335). Thereafter, the arrangement determining unit 132 instructs the server rack 1000 and the virtual server 500 to perform the operation switching, the backup recovery, the start of the server machine 1015, and the like (step S337), and then ends the process.

The present embodiment can physically prevent the worker 10 working on the particular server rack 1000 from accessing any other server rack 1000, thereby achieving improved machine security. In addition, space in the data center can be effectively used as compared to a case where an area is divided by, for example, a cage.

The movement of the server rack 1000 is controlled in accordance with a use condition of the work area 50 and a movement condition of any other server rack, and thus, thereby preventing an accident such as collision, for example, when a plurality of server racks move simultaneously.

[b] Second Embodiment

The first embodiment describes the configuration in which the server rack 1000 is moved from the installation area 30 to the work area 50, and the server rack 1000 is returned to the original location in the installation area 30 at work completion, but the embodiments are not limited thereto. For example, an installation location may be selected when the server rack 1000 is returned from the work area 50 to the installation area 30. A rearrangement may be performed when moving a plurality of server racks leaves a large number of vacant places in the installation area. A second embodiment describes a configuration in which the server rack 1000 is moved from the work area 50 to the installation area 30.

Entire Process

Figures 15, 16:
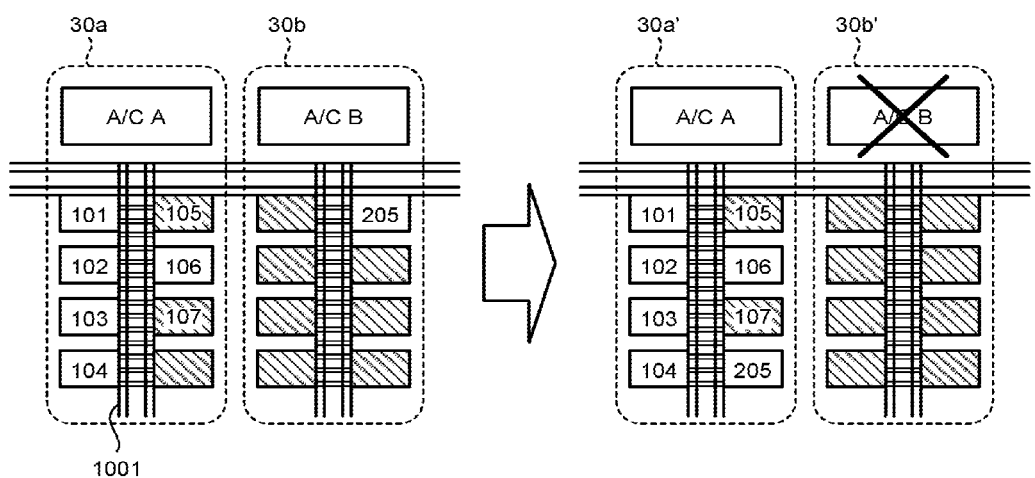
FIG. 15 is an explanatory diagram illustrating an exemplary arrangement of racks according to a second embodiment.
FIG. 16 is a diagram illustrating exemplary information stored in an updated server rack DB in the second embodiment.

The following describes selection of the installation location of the server rack 1000 according to the present embodiment with reference to FIG. 15. FIG. 15 is a diagram illustrating an exemplary arrangement of racks according to the second embodiment. In FIG. 15, regions labeled with the reference signs 30a and 30a' are air-conditioning zones corresponding to the air-conditioning zone 30a in FIG. 1, and regions labeled with the reference signs 30b and 30b' are air-conditioning zones corresponding to the air-conditioning zone 30b in FIG. 1. The pair of the regions 30a and 30a' or the pair of the regions 30b and 30b' correspond to the arrangement of the server racks 1000 before and after a change of an air-conditioning zone.

Similarly to FIG. 1, each air-conditioning zone includes eight installation locations, and the installation locations are connected with each other through the rail 1001. In FIG. 15, similarly to FIG. 1, each installation location illustrated by a white rectangle indicates that the server rack 1000 is installed at the installation location. Each installation location illustrated by a hatched rectangle indicates that no server rack 1000 is currently installed at the installation location. A number labeling each installation location indicates the rack number of the server rack 1000 currently installed at the corresponding installation location or expected to return to the installation location at work completion.

In the air-conditioning zone 30a in FIG. 15, the server racks 1000 are installed at five of the eight installation locations. Two server racks 1000 with the rack numbers "105" and "107" are currently moving and expected to return to the air-conditioning zone 30a. In the air-conditioning zone 30b in FIG. 15, the server rack 1000 is installed only at one of the eight installation locations, at which the server rack 1000 with the rack number "205" is installed.

The air-conditioning zone 30a' and the air-conditioning zone 30b' in FIG. 15 illustrate an exemplary changed arrangement of the server racks 1000 with this configuration. A server rack with the rack number "205" 1000 installed in the air-conditioning zone 30b in FIG. 15 is relocated to the air-conditioning zone 30a' in the changed arrangement. Accordingly, the server racks 1000 are installed at six of the eight installation locations in the air-conditioning zone 30a' in FIG. 15, whereas no server rack 1000 is installed in the air-conditioning zone 30b' in FIG. 15. In this case, the operation of "A/C B" for this air-conditioning zone can be stopped because no server 1000 is installed in the air-conditioning zone 30b', which leads to a reduction in an operation cost of the data center 1.

System Configuration

The configuration of the system and the functional configuration of the management server in the present embodiment are the same as those in the first embodiment, and thus detailed description thereof will be omitted and the following describes processing different from that in the first embodiment.

The communicating unit 131 acquires information such as a measured temperature at an installation location from the installation area 30a1 or the server rack 1000, and outputs the information to the arrangement determining unit 132.

The arrangement determining unit 132 receives the input information such as the temperature and updates the installation area DB 123. The arrangement determining unit 132 checks the use condition of an installation location included in the air-conditioning zone of each controlling A/C by referring to the installation area DB 123. The example in FIG. 7 indicates that the server racks 1000 are installed in five areas of "Area-A1" to "Area-A4" and "Area-A6" among the eight installation locations included in the air-conditioning zone 30a. It is also indicated that the server racks 1000 in the installation locations "Area-A5" and "Area-A7" are moving and expected to return to the installation locations at work completion. "Area-A8" is "empty". Thus, another server rack 1000 can be installed in the installation location "Area-A8" in the air-conditioning zone 30a.

In this case, the arrangement determining unit 132 determines, by referring to the installation area DB 123, whether the air-conditioning zone 30b and any other air-conditioning zone include an air-conditioning zone in which only a single server rack 1000 is installed. Having determined that such an air-conditioning zone exists, the arrangement determining unit 132 specifies the rack number of a server rack 1000 installed in this air-conditioning zone by referring to the installation area DB 123, and then updates the "Installation location" cell corresponding to this rack number in the server rack DB 126.

For example, the installation area DB 123 illustrated in FIG. 7 indicates that only the server rack 1000 with the rack number "205" installed in "Area-B5" is installed in the air-conditioning zone 30b. In this case, the arrangement determining unit 132 updates the installation location cell in the server rack DB 126 illustrated in FIG. 10.

FIG. 16 illustrates an example of the updated server rack DB 126. FIG. 16 is a diagram illustrating exemplary information stored in the updated server rack DB in the second embodiment. As indicated by the reference sign 1501 in FIG. 16, the installation location cell corresponding to the rack number "205" in the server rack DB 126 is changed from "Area-B5" in the air-conditioning zone 30b to "Area-A8" in the air-conditioning zone 30a.

When the server rack 1000 with the rack number "205" moves to the work area 50 and back to the installation area 30, the arrangement determining unit 132 refers to the installation location ID stored in this updated server rack DB 126. In this manner, the arrangement determining unit 132 instructs to move the server rack 1000 with the rack number "205" to the installation location "Area-A8" instead of the installation location "Area-B5". The arrangement determining unit 132 may instruct to stop "A/C B" as the controlling A/C of the air-conditioning zone 30b in which no server rack 1000 is installed. This allows any unnecessary A/C to stop, thereby achieving a reduction in the operation cost.

Process of Arrangement Change Processing at Management Server

Figure 17:
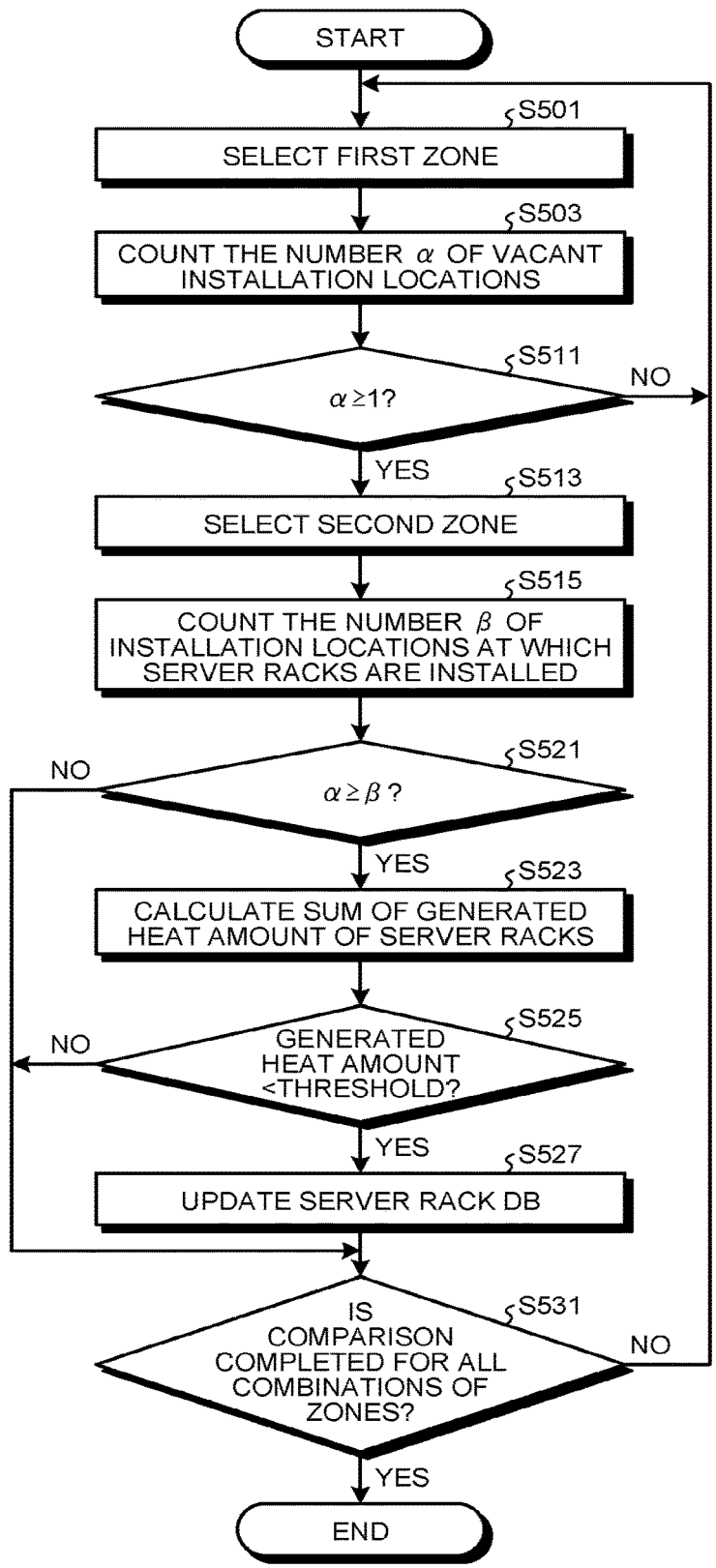
FIG. 17 is a flowchart of exemplary arrangement change processing according to the second embodiment.

The following describes the process of the above-described arrangement change processing with reference to FIG. 17. FIG. 17 is a flowchart of exemplary arrangement change processing according to the second embodiment. First, the arrangement determining unit 132 of the management server 100 selects, by referring to the installation area DB 123, a first air-conditioning zone from among air-conditioning zones grouped in accordance with controlling A/Cs (step S501). Next, the arrangement determining unit 132 counts a value a as the number of vacant installation locations in the first air-conditioning zone, in other words, the number of records with the rack number "empty" in the installation area DB 123 (step S503).

Next, the arrangement determining unit 132 determines whether the number α of vacant installation locations is equal to or larger than one (step S511). If α is zero (No at step S511), the arrangement determining unit 132 selects the next first air-conditioning zone back at step S501. If α is equal to or larger than one (Yes at step S511), the arrangement determining unit 132 selects a second air-conditioning zone by referring to the installation area DB 123 (step S513). Next, the arrangement determining unit 132 counts the number of installation locations at which server racks are installed in this first air-conditioning zone, in other words, the number β of records with rack numbers other than "empty" in the installation area DB 123 (step S515).

Next, the arrangement determining unit 132 determines whether the number α of vacant installation locations in the first air-conditioning zone is equal to or larger than the number β of installation locations at which server racks are installed in the second air-conditioning zone (step S521). If α is less than β (No at step S521), the process proceeds to step S531.

If α is equal to or larger than β (Yes at step S521), the arrangement determining unit 132 calculates the sum of generated heat amounts of server racks installed in the first air-conditioning zone and the second air-conditioning zone by referring to the installation area DB 123 and the server rack DB 126 (step S523). Next, the arrangement determining unit 132 determines whether the sum of generated heat amounts is less than a predetermined threshold (step S525). If the sum of generated heat amounts is equal to or larger than the threshold (No at step S525), the process proceeds to step S531.

If the sum of generated heat amounts is less than the threshold (Yes at step S525), the arrangement determining unit 132 updates the installation location cell in the server rack DB 126 (step S527). Thereafter, the arrangement determining unit 132 checks whether the comparison is completed for all combinations of air-conditioning zones (step S531). If the comparison is yet to be completed (No at step S531), the process returns to step S501 to repeat the processing on a combination of the first air-conditioning zone and the second air-conditioning zone for which the comparison is not completed. If the comparison is completed (Yes at step S531), the process ends.

As a result of update of "Installation location" in the server rack DB 126 through the process, in the leaving processing illustrated in FIG. 14, the server rack 1000 moves to a new installation location based on the update instead of the old installation location before the movement. In the processing at step S335 in FIG. 14, the arrangement determining unit 132 may instruct the controlling A/C of an air-conditioning zone including the old installation location, to stop air conditioning.

With the above-described configuration, upon a movement of the server rack 1000, the arrangement of server racks can be changed to an arrangement suitable for, for example, achieving an air-conditioning efficiency. Although the present embodiment describes the selection of the installation location when the server rack 1000 is moved from the work area 50 to the installation area 30, the embodiments are not limited thereto. For example, the arrangement determining unit 132 may move, at an optional timing, the server rack 1000 installed in a particular installation location to another installation location stored in the updated server rack DB 126. Accordingly, an arrangement of server racks suitable for, for example, achieving an air-conditioning efficiency can be easily achieved at an optional timing independently from the movement of the server rack 1000 to the work area 50.

In the present embodiment, the server rack 1000 is moved to reduce the number of vacant installation locations in an air conditioning range, but the embodiments are not limited thereto. For example, the server rack 1000 may be moved so as to avoid concentration of the server racks 1000 with large generated heat amounts at a particular air conditioning range. When a measured temperature exceeds a predetermined threshold in a particular air-conditioning zone, the server rack 1000 with a largest generated heat amount may be specified and instructed to move to an air-conditioning zone with a small sum of generated heat amounts.

Although the present embodiment describes the configuration in which a single server rack 1000 is moved, the embodiments are not limited thereto. For example, the arrangement determining unit 132 may move, at an optional timing, a plurality of server racks 1000 installed in a particular installation location to installation locations stored in the updated server rack DB 126.

[c] Third Embodiment

Although the above describes the embodiments of the present invention, the present invention may be achieved with various kinds of different configurations other than the above-described embodiments. For example, the pieces of processing illustrated in FIGS. 11, 12, 13, 14, and 17 are not limited to the above-described orders, but may be performed simultaneously or in a different order without causing inconsistency in the content of the processing. For example, in the above disclosure, the worker 10 is specified first, and then the server rack 1000 as the target of work by the worker is specified, but the present invention is not limited thereto. The server rack 1000 may be specified first, followed by specification of the worker 10.

Among the pieces of processing described in the present embodiments, all or some pieces of processing described as automatically performed processing may be manually performed. Alternatively, all or some pieces of processing described as manually performed processing may be automatically performed by the well-known method. In addition, information including processing procedures, control procedures, specific names, and various kinds of data and parameters described in the above specification and drawings may be optionally changed unless otherwise stated.

In the first embodiment, when specifying a work room from among a plurality of available work rooms, the arrangement determining unit 132 may specify a work room for which the normal movement time is shortest by referring to the path DB 124 and the server rack DB 126. For example, the arrangement determining unit 132 specifies that the server rack 1000 with the rack number "105" is installed in "Area-A5" by referring to the server rack DB 126 illustrated in FIG. 10. Next, the arrangement determining unit 132 specifies, for example, by referring to the path DB 124 illustrated in FIG. 10, "Work Room A" as a work room for which a movement route from "Area-A5" is shortest from among available work rooms. With this configuration, cost needed for the movement of the server rack 1000 can be reduced.

When specifying a work room, the arrangement determining unit 132 may select, for example, a work room with no other server rack 1000 on a movement path to the work room from an installation location. Accordingly, a movement stop due to any other server rack 1000 on the movement path can be avoided.

In the entry processing illustrated in FIG. 13, the arrangement determining unit 132 updates the movement destination in the work area DB 122 from "empty" to the rack number of the corresponding server rack 1000 at completion of the movement of the server rack 1000, but the embodiments are not limited thereto. For example, the work area DB 122 may be updated at the start of the movement of the server rack 1000. This configuration can prevent allocation of the same work room to two workers 10 when two entry applications are submitted in a short time. When the server rack 1000 has not completed the movement for any reason, the arrangement determining unit 132 may update the rack number in the work area DB 122 back to "empty" so as to allow any other worker 10 to use the corresponding work room.

The above describes the example in which the movement of the server rack 1000 is stopped if any other server rack 1000 exists on a movement path at step S123 in FIG. 13, but the embodiments are not limited thereto. For example, if any other server rack 1000 exists on the movement path, one of the server racks 1000 may be retracted to any other "empty" installation location or work room. With this configuration, even when a plurality of server racks 1000 move on the same line, each server rack 1000 can achieve a smooth movement without moving backward. For example, the movement management DB 125 illustrated in FIG. 11 may additionally store therein the priority of each server rack 1000. With this configuration, when a plurality of server racks 1000 exist on the same line, the server rack 1000 with a lower priority may be stopped moving or retracted.

The configurations of the data center 1 and the server rack 1000 are not limited to the embodiments described with reference to FIGS. 2 and 3. For example, the data center 1 and the server rack 1000 may be configured such that no rail 1001 is laid in the data center 1 and the server rack 1000 moves on the floor of the data center 1 by using the wheels 1002, or the rail 1001 is installed on the ceiling 1041 instead of the floor. When the server rack 1000 is not to be operational while moving, the server rack 1000 may have such a configuration in which the uninterruptible power source 1011, the dedicated A/C 1012, and the wireless device 1022 are not included.

A method of detecting the position of the server rack 1000 while moving is not limited to the embodiments described with reference to FIGS. 2 and 3. For example, the position of the server rack 1000 may be detected based on the condition of communication between a plurality of access points 1051 and the server rack 1000. Alternatively, the server rack 1000 may transmit movement states such as stopping and forward moving to the management server 100, or may transmit position information to the management server 100 upon reception of a signal from the trolley contactor 1061.

Components of devices illustrated in the drawings represent conceptual functions and are not necessarily physically configured as illustrated in the drawings. In other words, specific configurations of distribution and integration of the devices are not limited to the illustrated configurations. All or some of the devices may be functionally or physically distributed and integrated in optional units depending on various loads and use conditions. For example, the management server 100 may integrally perform the functions of the administrator operating device 200 and the virtual server 500. All or an optional part of processing functions of the devices may be achieved by a CPU and computer programs analyzed and executed by this CPU, or may be achieved as wired logic hardware.

System

The above describes each of the embodiments related to the disclosed system. The following describes an exemplary hardware configuration of the management server 100 in each of the embodiments. All or an optional part of various processing functions performed by devices may be executed by a CPU (MPU or micro computer such as a microcontroller unit (MCU)). In addition, all or an optional part of the various processing functions may be executed on a computer program analyzed and executed by the CPU (MPU or micro computer such as a MCU), or on a wired logic hardware. Various pieces of processing described in each of the embodiments can be achieved by a computer executing a computer program prepared in advance. The following describes, as an exemplary hardware configuration, an exemplary computer configured to execute a program having the same function as that in each of the embodiments.

Figure 18:
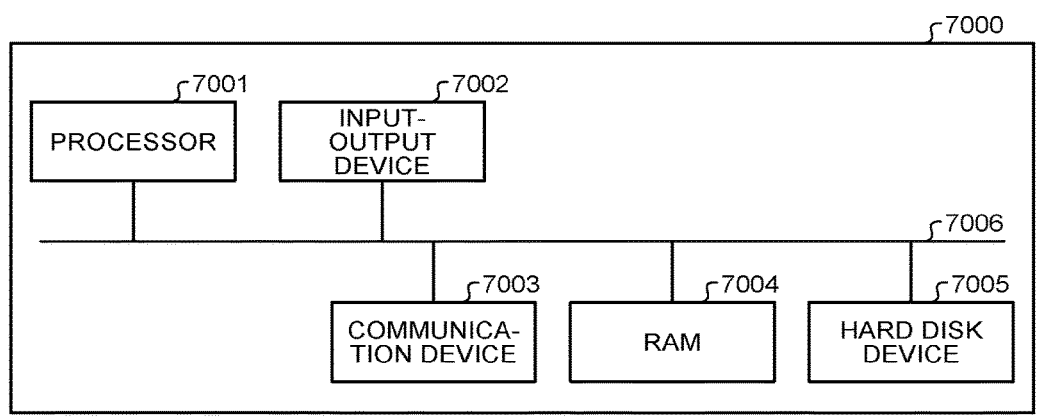
FIG. 18 is a diagram illustrating an exemplary hardware configuration.

FIG. 18 is a diagram illustrating an exemplary hardware configuration. The management server 100 can be achieved with the same hardware configuration as that of a server device 7000 illustrated in FIG. 18.

As illustrated in FIG. 18, the server device 7000 includes a processor 7001 configured to execute various pieces of arithmetic processing, an input-output device 7002, and a communication device 7003 for establishing wired or wireless connection with a mobile terminal and a station device. The server device 7000 also includes a RAM 7004 configured to temporarily store therein various kinds of information, and a hard disk device 7005. These devices 7001 to 7005 are connected with each other through a bus 7006.

The hard disk device 7005 stores therein a movement management program having the same functions as those of the communicating unit 131, the arrangement determining unit 132, the position detecting unit 133, and the operation switching unit 134 described in each of the embodiments. The hard disk device 7005 also stores therein the worker DB 121, the work area DB 122, the installation area DB 123, the path DB 124, the movement management DB 125, and the server rack DB 126. The hard disk device 7005 also stores therein various kinds of data for achieving the movement management program.

The processor 7001 reads each computer program stored in the hard disk device 7005, loads the computer program onto the RAM 7004, and executes the computer program so as to perform various kinds of processing. These computer programs enables the server device 7000 to function as the communicating unit 131, the arrangement determining unit 132, the position detecting unit 133, and the operation switching unit 134 described in each of the embodiments. The computer programs do not necessarily need to be stored in the hard disk device 7005. For example, the computer programs may be stored in a storage medium readable by the server device 7000, and may be read and executed by the server device 7000.

According to an aspect of one embodiment, security during work can be improved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:
1. A movement management device comprising:
a memory; and
a processor that is connected to the memory, wherein the processor executes a process including:
first specifying, when a data center includes separated areas of a first area in which a server rack is installed and a second area in which a worker operates a server rack, a worker who enters the second area, based on worker information stored in a database:
second specifying a target server rack to be operated by the specified worker from among a plurality of server racks installed in the first area based on the worker information including information related the target server rack to he operated by the worker; and
outputting a moving instruction to a drive control unit so as to move the specified target server rack from the first area to the second area.

2. The movement management device according to claim 1, wherein the process further comprises:
third specifying a movement path of the target server rack; and
fourth specifying current positions of the target server rack and any other server rack, wherein
when any other server rack exists on the movement path, the outputting includes outputting a moving instruction to the drive control unit so as to stop movement of the target server rack until the other server rack moves off the movement path.

3. The movement management device according to claim 1, wherein the process further comprises:
counting the number of vacant installation locations at which no server rack is installed for each of air-conditioning zones obtained by dividing the first area in accordance with target ranges of A/Cs; and
determining a target air-conditioning zone that includes a location to which the target server rack is controlled to be moved from the second area, based on the counted number of vacant installation locations and an air-conditioning efficiency of the air-conditioning zones, wherein
the outputting includes outputting a moving instruction to the drive control unit so as to move the target server rack to the determined target air-conditioning zone.

4. The movement management device according to claim 1, wherein the outputting backs up data stored in a server mounted on the target server rack to a predetermined server before moving the target server rack, and restores the data backed up to the predetermined server to the server mounted on the target server rack after movement to the second area is completed.

5. The movement management device according to claim 1, wherein the second specifying calculates a movement time between each second area that any other worker has not entered among a plurality of second areas and an installation position of the specified target server rack, and allocates a second area the movement time of which is shortest to the worker.

6. A movement management method comprising:
specifying, when a data center includes separated areas of a first area in which a server rack is installed and a second area in which a worker operates a server rack, a worker who enters the second area, based on worker information stored in a database, by a processor;
specifying a target server rack to be operated by the specified worker from among a plurality of server racks installed in the first area based on the worker information including information related the target server rack to be operated by the worker, by the processor; and
outputting a moving instruction to a drive control unit so as to move the specified target server rack from the first area to the second area, by the processor.

7. A non-transitory computer-readable recording medium having stored therein a program that causes a computer to execute a movement management process comprising:
specifying; when a data center includes separated areas of a first area in which a server rack is installed and a second area in which a worker operates a server rack, a worker who enters the second area, based on worker information stored in a database;
specifying a target server rack to be operated by the specified worker from among a plurality of server racks installed in the first area based on the worker information including information related the target server rack to be operated by the worker; and outputting a moving instruction to a drive control unit so as to move the specified target server rack from the first area to the second area.

\* \* \* \* \*